(12) United States Patent
Johnson

(10) Patent No.: US 11,215,678 B2
(45) Date of Patent: Jan. 4, 2022

(54) ELECTRICAL CONTINUITY DETECTION SYSTEM

(71) Applicant: Avista Corporation, Spokane, WA (US)

(72) Inventor: Gregory Ryan Johnson, Spokane, WA (US)

(73) Assignee: Avista Corporation, Spokane, WA (US)

( * ) Notice: Subject to any disclaimer, the term of this patent is extended or adjusted under 35 U.S.C. 154(b) by 207 days.

(21) Appl. No.: 16/457,444

(22) Filed: Jun. 28, 2019

(65) Prior Publication Data

US 2020/0408825 A1 Dec. 31, 2020

(51) Int. Cl.
| | |
|---|---|
| *G01R 31/14* | (2006.01) |
| *G01R 31/50* | (2020.01) |
| *G01R 31/52* | (2020.01) |
| *G01R 31/40* | (2020.01) |
| *G01R 31/42* | (2006.01) |
| *G01R 27/18* | (2006.01) |
| *G01R 31/00* | (2006.01) |
| *G01R 31/08* | (2020.01) |
| *H02H 3/16* | (2006.01) |
| *H02H 3/33* | (2006.01) |

(52) U.S. Cl.
CPC ............ *G01R 31/50* (2020.01); *G01R 27/18* (2013.01); *G01R 31/006* (2013.01); *G01R 31/086* (2013.01); *G01R 31/40* (2013.01); *G01R 31/42* (2013.01); *G01R 31/52* (2020.01); *H02H 3/16* (2013.01); *H02H 3/335* (2013.01)

(58) Field of Classification Search
CPC ........ G01R 31/52; G01R 31/40; G01R 31/42; G01R 27/18; G01R 31/006; G01R 31/086; G01R 31/50; G01R 31/088; G01R 31/54; H02H 3/16; H02H 3/335
USPC ................ 324/500, 508, 509, 541, 544, 551
See application file for complete search history.

(56) References Cited

U.S. PATENT DOCUMENTS

| | | | | |
|---|---|---|---|---|
| 2009/0242633 | A1* | 10/2009 | Salfelner | G01S 13/75 235/439 |
| 2010/0185055 | A1* | 7/2010 | Robertson | A61B 5/6846 600/117 |
| 2011/0133905 | A1* | 6/2011 | Hussain | G06K 7/10366 340/10.42 |
| 2015/0051465 | A1* | 2/2015 | Robertson | A61B 5/0028 600/345 |
| 2016/0092640 | A1* | 3/2016 | Caputo | G06K 7/10356 235/385 |
| 2016/0200332 | A1* | 7/2016 | Noffsinger | B61L 3/10 246/121 |

(Continued)

*Primary Examiner* — Raul J Rios Russo
(74) *Attorney, Agent, or Firm* — Lee & Hayes, P.C.

(57) ABSTRACT

An electrical continuity detection system may comprise a plurality of identification tags placed on an electrically conductive object, and configured to respond to an injection signal on the electrically conductive object with a response, and a monitoring device coupled to the electrically conductive object and configured to generate the injection signal and an injection signal on the electrically conductive object, receive the response from one or more of the plurality of tags, receive a return signal from the electrically conductive object, determine a characteristic of the electrically conductive object based on the received responses and return signals, and generate a notification based on the characteristic.

33 Claims, 10 Drawing Sheets

(56) References Cited

U.S. PATENT DOCUMENTS

2019/0061794 A1\* 2/2019 Noffsinger ............ B61L 23/044

\* cited by examiner

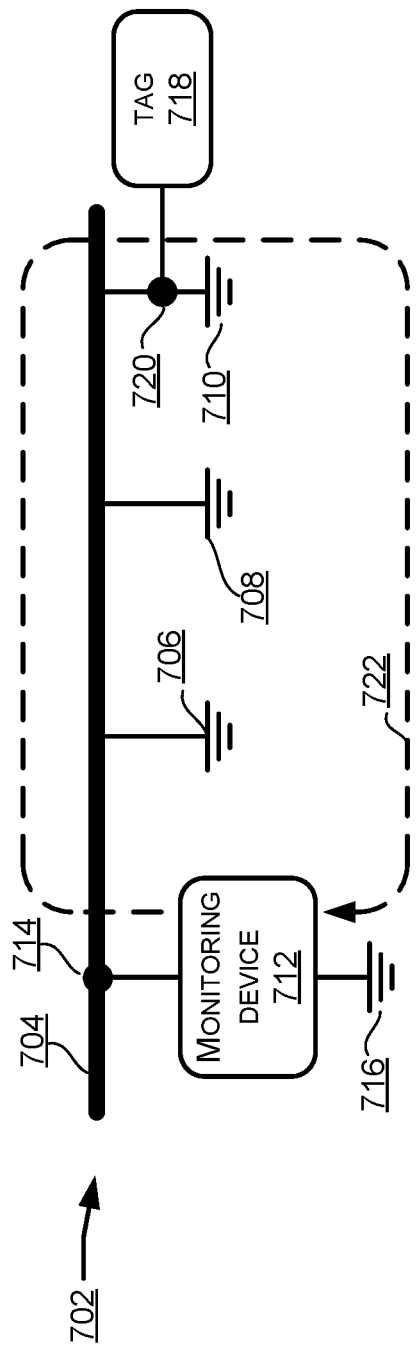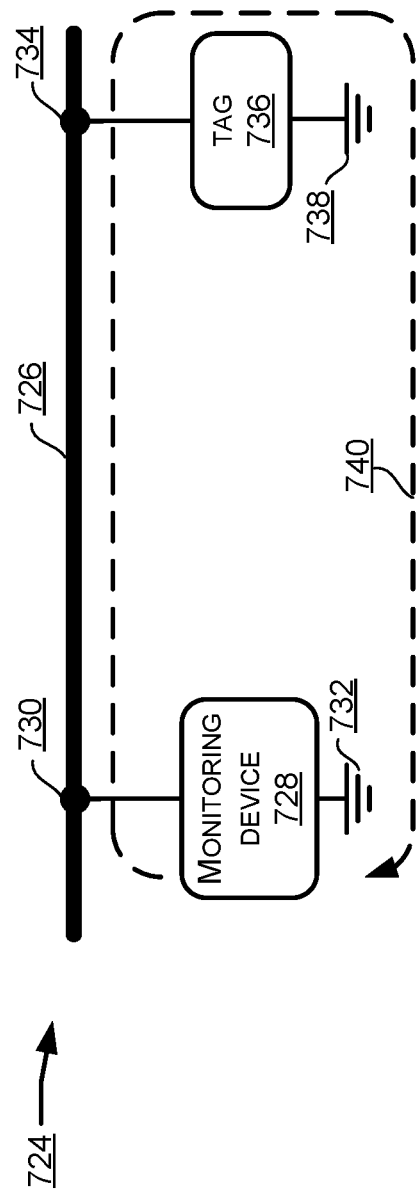

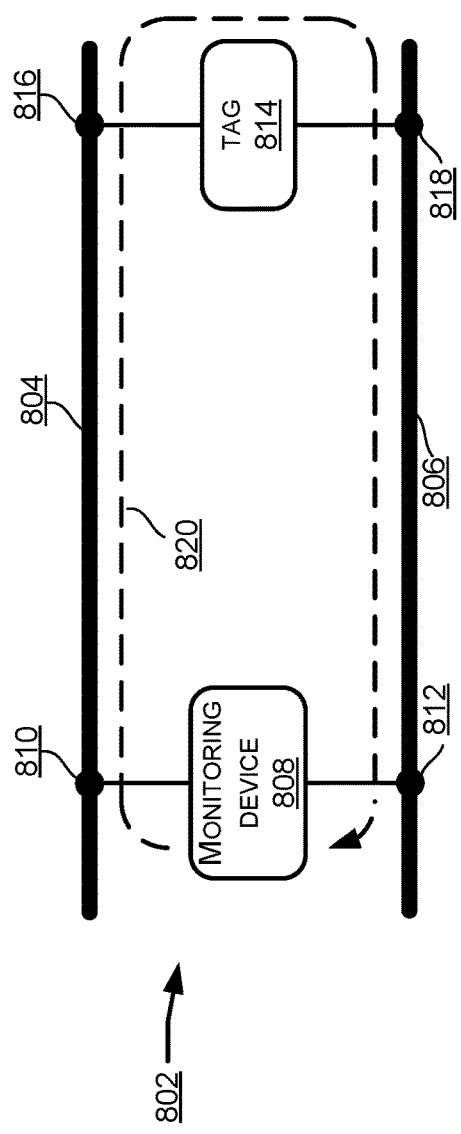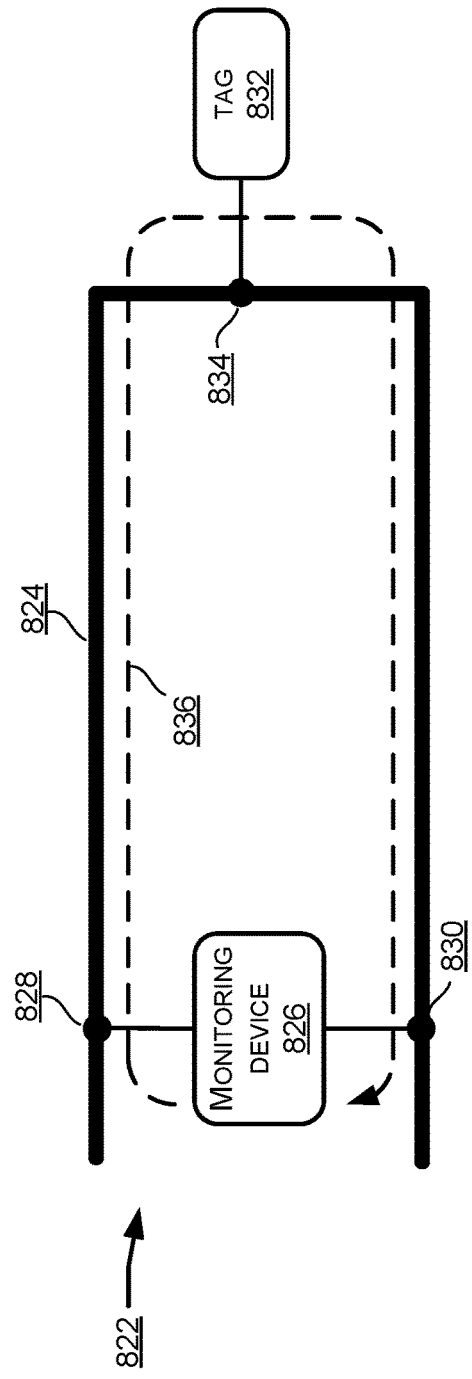

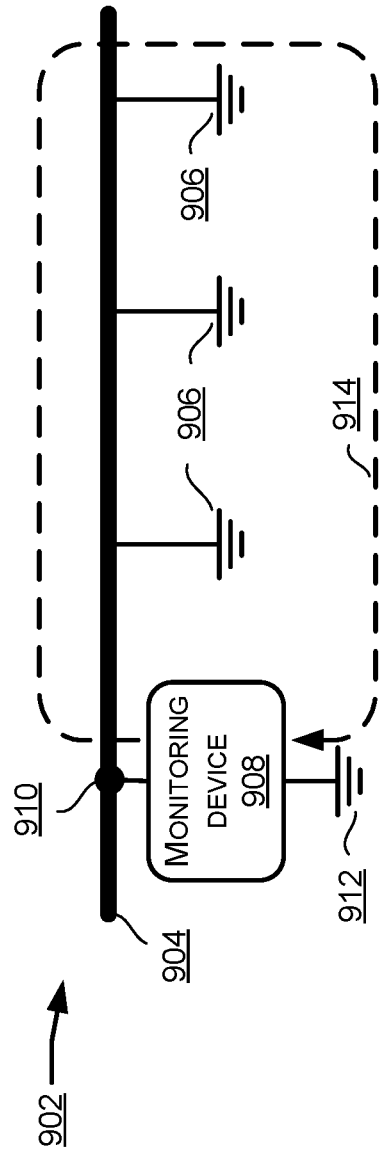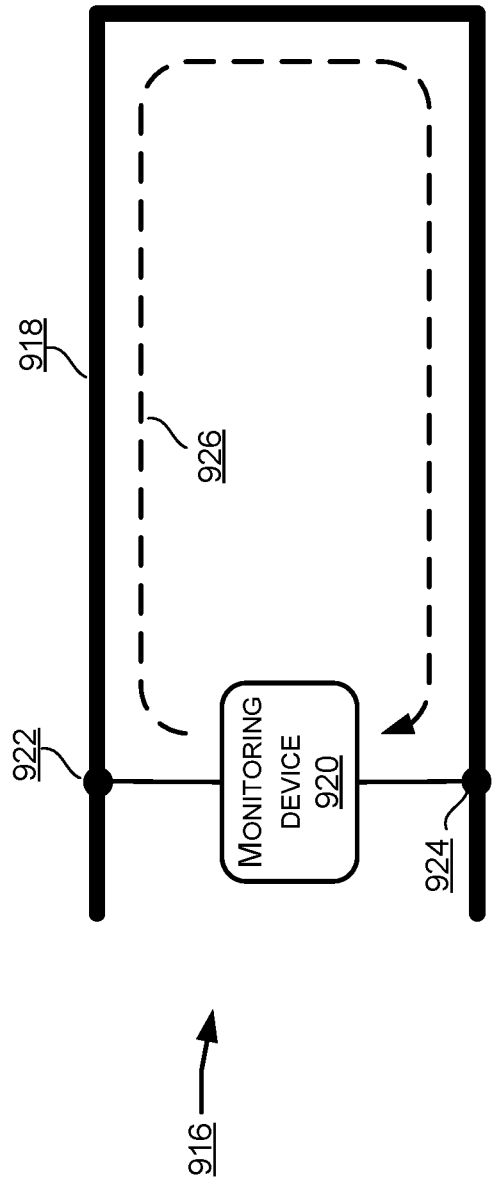

ELECTRICAL CONTINUITY DETECTION SYSTEM

BACKGROUND

Copper's low impedance, corrosion resistance, and thermal conductivity properties make it the ideal metal for a variety of applications including but not limited to electrical, communication, plumbing; and heating ventilation and air conditioning (HVAC) systems. Thieves, however, target copper due to its high scrap value and prevalent use in buildings and utility infrastructure. Copper theft has far reaching impacts, much greater than the economic cost of the copper loss itself. Removal of copper wire, pipes, or equipment can severely compromise various critical systems used to protect both equipment and humans. Worse yet, the removal of copper may go undetected for significant periods of time as is the case when copper wires are removed electrical grounding systems. A compromised grounding system not only risks equipment damage, but also puts workers, the public, and thieves at risk of electrical shock or electrocution.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items or features.

FIGS. 7A and 7B illustrate example signal paths, or electrical loops, between a monitoring device and a tag using the earth as the return electrical path.

FIGS. 8A and 8B illustrate example signal paths, or electrical loops, between a monitoring device and a tag using one or more electrically conductive objects as the return electrical path.

FIGS. 9A and 9B illustrate example signal paths, or electrical loops, for a monitoring device through an electrically conductive object.

DETAILED DESCRIPTION

Systems, devices, and techniques discussed herein are directed to providing continuity detection techniques, and more specifically to providing a notification upon detecting a change in an overall characteristic of a monitored system and location(s) of suspected trouble area(s).

An electrical continuity detection system may comprise a plurality of identification tags, or tags, and a monitoring device. The plurality of tags may be placed on an electrically conductive object, where each tag may be configured to respond to an injection signal on the electrically conductive object with a response. The electrically conductive object may be a wire/cable, a metallic pipe, a metallic wireway, a device, a component, or a plurality of parts in combination forming one or more electrically conductive objects. The monitoring device may be coupled to the electrically conductive object and may generate the injection signal on the electrically conductive object, receive the response from one or more of the plurality of identification tags, determine a characteristic of the electrically conductive object based on the received responses, and generate a notification based on the characteristic. The monitoring device may be further configured to store location information associated with each of the plurality of tags, and generate a notice including location information of one or more of the plurality of tags based on the received responses.

The monitoring device may be further configured to generate and inject a plurality of injection signals into the electrically conductive object, monitor a corresponding change in a return signal attribute, and generate a notification upon detecting a change in the return signal attribute that exceeds a threshold, which may be predetermined or dynamically set. The attribute may include any combination of measured property or calculated resultant from the measured property such as a voltage, a current, a phase angle, a frequency, a latency, a duration, a slew rate, a frequency response, a resistance, an inductance, a capacitance, an impedance, a phase shift, a frequency shift, and an electrical length.

Figure 1:
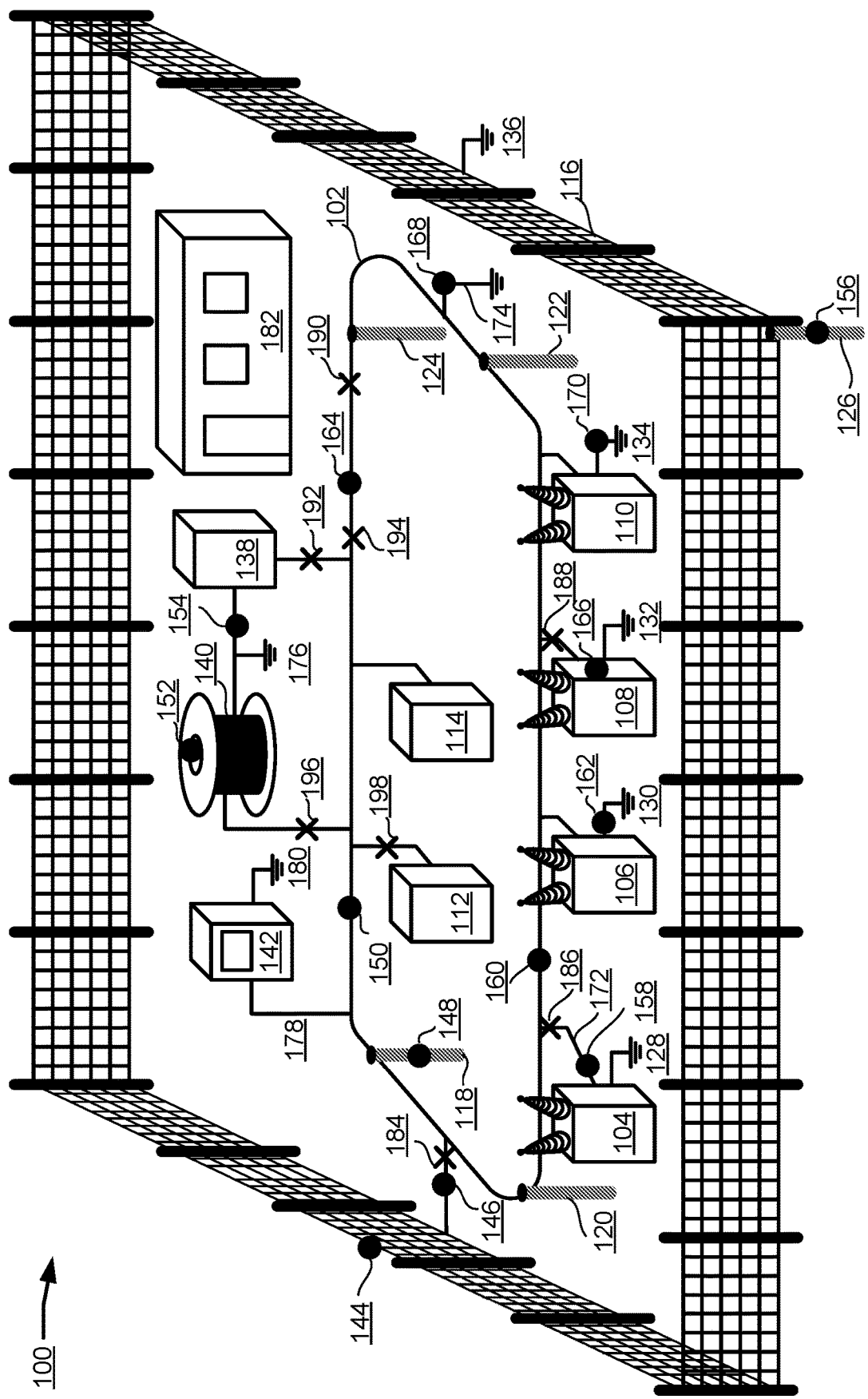
FIG. 1 illustrates an example of an electrical continuity detection system applied to a grounding system of a substation.

FIG. 1 illustrates an example application of an electrical continuity detection system applied to the grounding system of a substation 100.

The substation 100 may include a grounding system 102 that maintains an equipotential for a plurality of equipment 104, 106, 108, 110, 112, and 114, fencing 116, and other metallic surfaces (not shown). The grounding system 102 may be bonded to earth through a series of ground rods 118, 120, 122, 124, and 126, or buried conductor (not shown). The equipment 104, 106, 108, and 110 and fencing 116 may have supplemental grounds to earth, or earth-grounds, 128, 130, 132, 134, and 136 respectively. The equipment 112 and 114 may lack supplemental grounds. The substation 100 may also contain unused equipment 138 and a material, such as a spool of cable 140 stored on premises, both of which may be grounded.

An electrical continuity detection system at the substation 100 may comprise of a monitoring device 142 and a plurality of identification tags, or simply tags, of which, 15 tags 144-170 are shown, placed at various locations of interest (points or locations to be monitored) on the grounding system 102 or connected to equipment 104, 106, 108, 110, 138, and 140 and fencing 116. The tags 144-170 may be placed, for example, on the bonding jumper 172 for the equipment 104 (tag 158), on the supplemental ground 130 for the equipment 106 (tag 162), embedded inside the equipment 108 (tag 166), utilized as an integral supplemental ground for the equipment 110 (tag 134), attached to the spool of cable 140 (tag 152), attached to a supplemental ground 174 for the grounding loop 102 (tag 168), or attached to a supplemental ground 176 for the unused equipment 138 (tag 154). The monitoring device 142 may be coupled via a cable 178 to the grounding system 102 and bonded to earth via 104. The monitoring device 142 may reside anywhere in the substation 100 including inside a panel house 182.

Each tag 144-170 may be configured to respond to an injection signal on the grounding system 102 from the monitoring device 142, with a response including its own unique identification. Each tag may comprise, or attached to, a signal coupler, variations of which are described in FIGS. 4A-4C, 5A-5C, and 6A-6C below. The signal coupler may couple an electrical signal, such as the injection signal from the monitoring device 142 on the electrically conductive object, such as the grounding system 102 to a receiver of the tag. In response to receiving the injection signal, a response generator, or a responder, of the tag may generate and transmit, a response, or a response signal, by with information stored in the tag, such as its identification or a corresponding code, to the monitoring device 142. The generated response may be coupled from the tag to the electrically conductive object via the signal coupler. For example, in response to the injection signal on the grounding system 102, the tag 144 may respond with a code identifying itself as Tag 1 (ex. 0001 in the hex code), the tag 146 with a code identifying itself as Tag 2 (ex. 0002 in the hex code), and so on till the tag 170 with a code identifying itself as Tag 15 (ex. 000F in the hex code).

If the grounding system 102 is severed, for example, at one or more locations 184-198, or any of equipment 104-114, unused material 140, or unused equipment 138, is removed, the injection signal and responses would not pass between the monitoring device 142 and tags 144-170. The monitoring device 142 may detect a failure to receive a response from one or more tags 144-170 and generate a notification containing information associated with the non-responsive tags and corresponding locations.

The monitoring device 142 may generate a plurality of signals, couple the plurality of signals to the grounding system 108, and monitor a change in a corresponding response and attributes associated with the response of each of the plurality of signals. The plurality of signals may be continuous, periodic, or intermittent. The attributes may include a reflected injection signal, a voltage, a current, a phase angle, a frequency, a latency, a duration, a slew rate, or a frequency response frequency of the signal where each of the plurality of signals may have a different response attributes from one another. The monitoring device 142 may also timestamp the response. For each signal, i.e., for each frequency, the monitoring device 142 may measure and record a corresponding response and determine, measure, or derive, associated attributes (default attributes) of the undisturbed grounding system 102 having all the expected components attached to it (default ground loop configuration). The corresponding signal characteristic may include calculated resultants such as a resistance, an inductance, a capacitance, an impedance, a phase shift, a frequency shift, or an electrical length and/or a reflection pattern or coefficient of the default ground loop configuration. The monitoring device 142 may also analyze a derivative of the reflected injection signal to identify the responding tag. Each tag, more specifically, a responder of each tag, may only respond to the injection signal having injection signal attributes, or each of injection signal attributes having a corresponding value, within a corresponding threshold range. The injection signal attributes may be similar to the attributes described above with regard to the response of each of the plurality of signals. Additionally, or alternatively, the tag may respond to all injection signals.

For example, the monitoring device 142 may generate five different frequency signals, f1 Hz, f2 Hz, f3 Hz, f4 Hz, and f5 Hz, and measure and record the corresponding default response attributes and calculated resultants, such as impedance, as Z1Ω, Z2Ω, Z3Ω, Z4Ω, and Z5Ω, respectively. As described above, if f1=100 MHz, f2=200 MHz, f3=300 MHz, f4=400 MHz, f5=500 MHz and the corresponding threshold range were +/−5 MHz for each frequency, a tag may not respond to the injection signal having a frequency of 90 MHz. If the monitoring device 142 were to detect a change that is larger, negatively or positively, than a threshold, the monitoring device 142 may send a notification. For example, for each frequency, f1 Hz, f2 Hz, f3 Hz, f4 Hz, and f5 Hz, there may be a corresponding threshold, Δ1 Ω, Δ2 Ω, Δ3 Ω, Δ4Ω, and Δ5Ω, respectively, and if a preselected one or any combination of the impedances exceeds the corresponding threshold(s), the monitoring device 142 may generate and/or transmit a notification as described above.

If the grounding system 102 were severed at one or more locations 184-198, or any of equipment 104-114, unused material 140, or unused equipment 138 were removed, the return signal quantity, attributes, and calculated resultants received and analyzed by the monitoring device 142 could be different from the default, or expected, values. The monitoring device 142 may detect these changes and generate a notification. The monitoring device 142 may be further configured to store location information associated with each of the plurality of tags 144-170, such as GPS coordinates and location description (attached to the equipment 108, connected to the ground of the equipment 110, buried with the ground rod 126, etc.).

Figure 2:
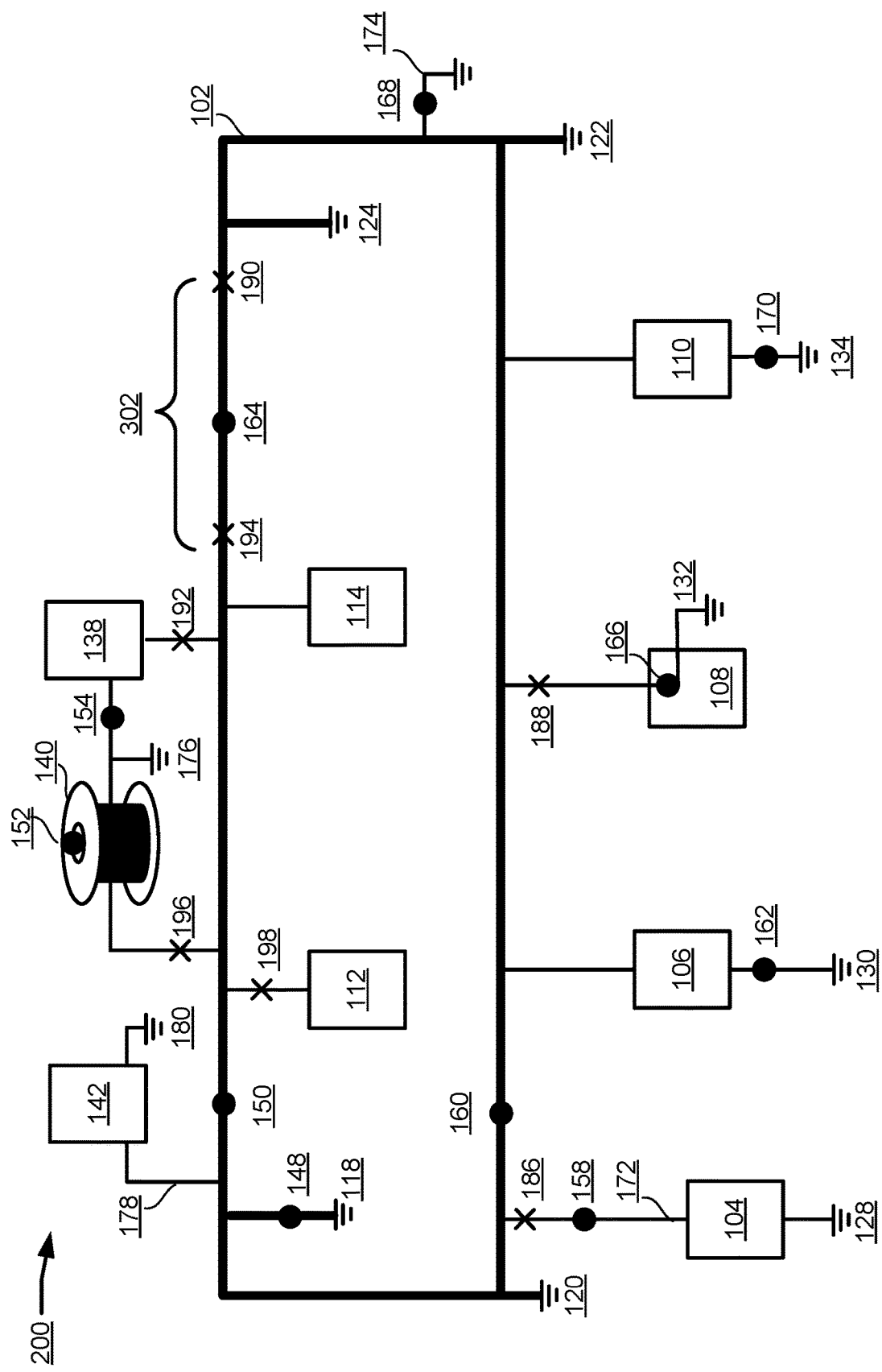
FIG. 2 illustrates a simplified example diagram of the electrical continuity detection system applied to the grounding system of the substation of FIG. 1.

FIG. 2 illustrates a simplified example diagram 200 of the electrical continuity detection system applied to the grounding system 102 of FIG. 1.

As the monitoring device 142 generates the injection signal on the grounding system 102, the monitoring device 142 is expected to receive from each of the tags 144-170 its unique corresponding identification information. However, if a section 302 of the grounding system 102 were cut, at locations 190 and 194, and missing, for example, removed and stolen by a thief, the tag 164 would not be able to respond to the injection signal, and the monitoring device 142 would not receive the response from the tag 164. By determining that the monitoring device 142 has failed to receive the responses from the tag 164, the monitoring device 142 may identify the missing, or non-responsive, tag 164. This lack of response from the tag 164 may instead indicate the status of the tag 164 being unable to respond to the injection signal due to its own defect, such as a loose or broken connection, internal malfunctioning, no power, and the like. By using the stored location information of the tags, the monitoring device 164 may generate a notification that include the location of the missing section 302 and an undisturbed section of the grounding system 102. The notification may be provided at the monitoring device 142 and/or the monitoring device 142 may transmit, or broadcast, the notification electronically or wirelessly to a remote location, such as a warning signal/indication on the fence 116 as shown in FIG. 1, a central data center, mobile unit, and the like. The notification may include location information of the missing, or non-responsive, tag(s), location information of the responding tags, a visual notification, such as a warning light or sign, an audio notification, such as a siren or warning sound, and the like at the monitoring device.

The tags 148, 150, 152, 156, 158, 160, 164, and 166 may be coupled to existing components and use the existing path of the grounding system 102 and earth-grounds 118, 120, 122, 124, 128, and 132 for receiving injection signals and sending responses. The tags 154, 162, 168, and 170 may contain an integral ground so as to complete the path from the grounding system 102 to the earth-ground 180 of the monitoring device 142 for receiving injection signals and sending responses.

Additionally, or alternatively, the monitoring device 142 may inject the injection signal, or the plurality of signals onto the electrically conductive object, such as the grounding system 102, with no tags attached. Similar to the process described above with the tags with regard to FIG. 1, the monitoring device 142 may monitor a change in a reflected signal and attributes associated with the reflected signal for each of the plurality of signals.

Figure 3:
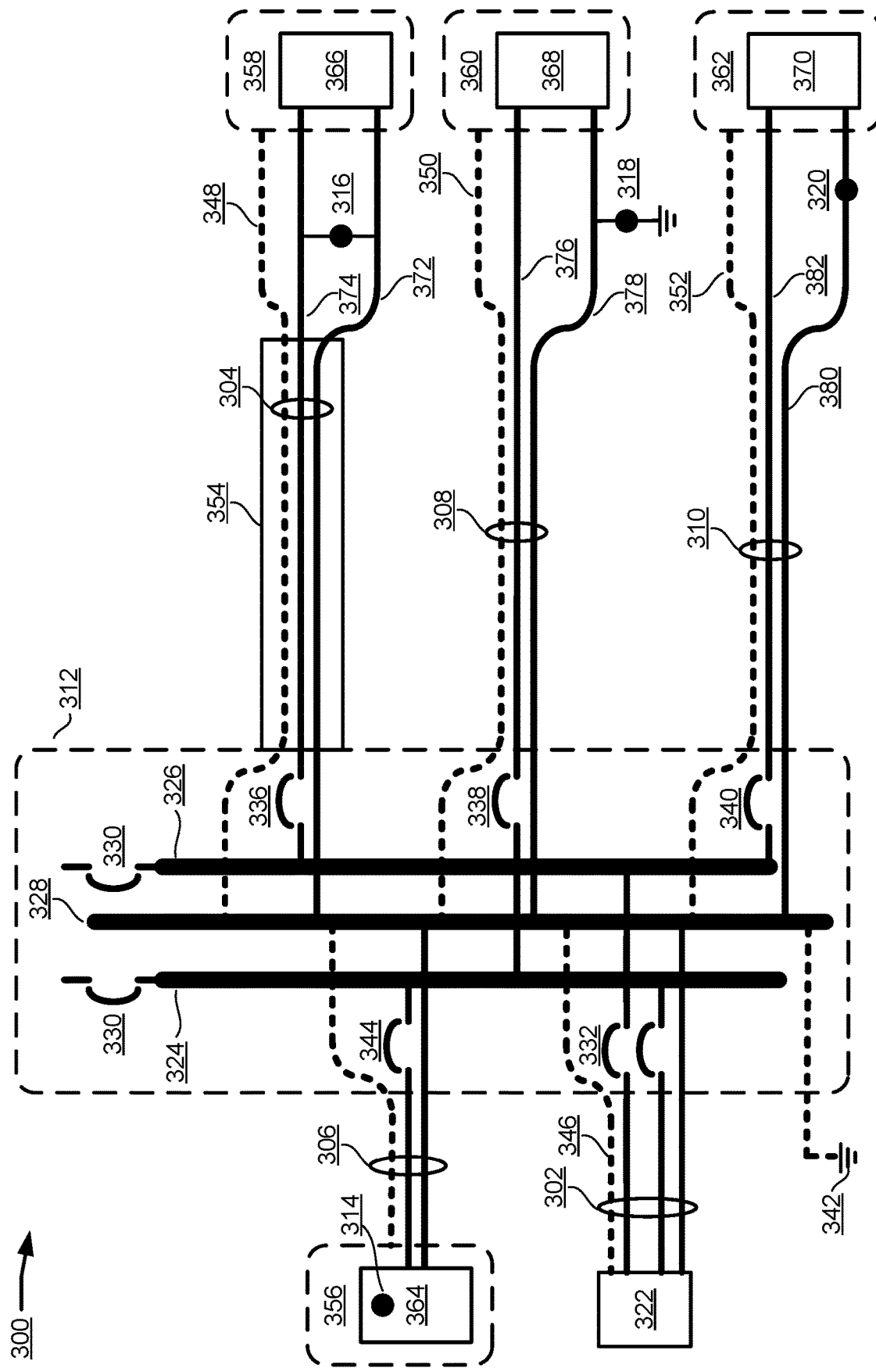
FIG. 3 illustrates a simplified example diagram of the electrical continuity detection system applied to ungrounded components of a building electrical system.

FIG. 3 illustrates a simplified example diagram of the electrical continuity detection system applied to ungrounded components of a building electrical system 300.

In this example embodiment, the building wiring 302, 304, 306, 308, and 310 and the electrical panel 312 of the building electrical system 300 are used to carry injection signals and responses between the tags 314-320 and the monitoring device 322. The electrical panel 312 may comprise bus bars 324, 326, and 328, circuit breakers 330, 332, 334, 336, 338, and 340, and an earth-ground 342. Wires 344, 346, 348, 350, and 352 are connected to the bus bar 328, and are grounded. The monitoring device 322 may be coupled to the building electrical panel 312 through a circuit breaker 332 which may either be a direct connection or via a plug-in receptacle. The building wiring 304 may be contained in raceway or conduit 354, or exposed 302, 306, 308, and 310. The monitored equipment 356, 358, 360 and 362 may comprise an enclosure, which may or may not be grounded, and internal components 364, 366, 368, and 370 that consume or produce power. The equipment 356, 358, 360, and 362 may be connected to the building electrical system 300 via circuit breakers or fuses 332, 334, 336, 338, and 340. The tag 316 may be connected between two current carrying wires 372 and 374 of the building wiring 304 upstream of the equipment 358 to provide protection for the equipment 358 in the event that it is disconnected. The tag 318 may be connected to one of current carrying conductors 376 and 378 of the building wiring 308 and grounded via a high impedance path to provide protection for the equipment 360. The tag 320 may be coupled to a single conductor 380 of two current carrying wires 380 and 382 of the building wiring 310 to provide protection to the equipment 362. The tag 314 may be built into equipment 356 to provide protection.

Figure 4A:
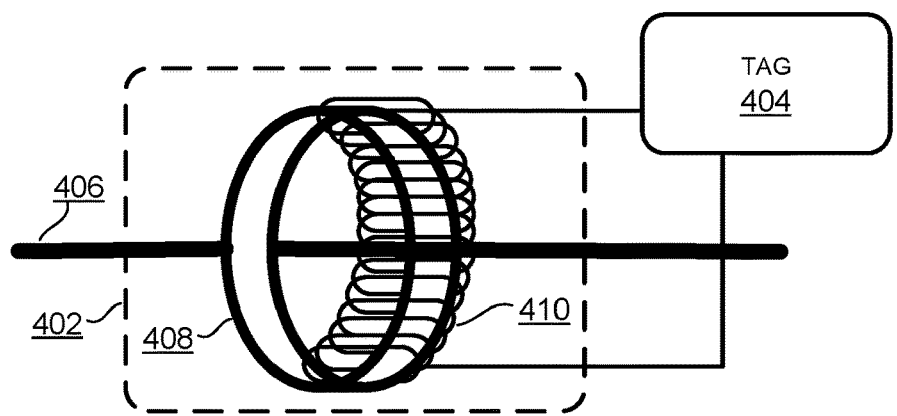
FIGS. 4A, 4B, and 4C illustrate example inductive signal coupling mechanisms usable with identification tags for the electrical continuity detection system.
Figure 4B:
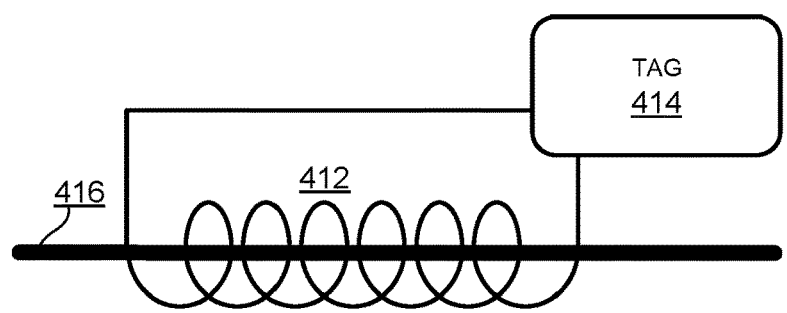
Figure 4C:
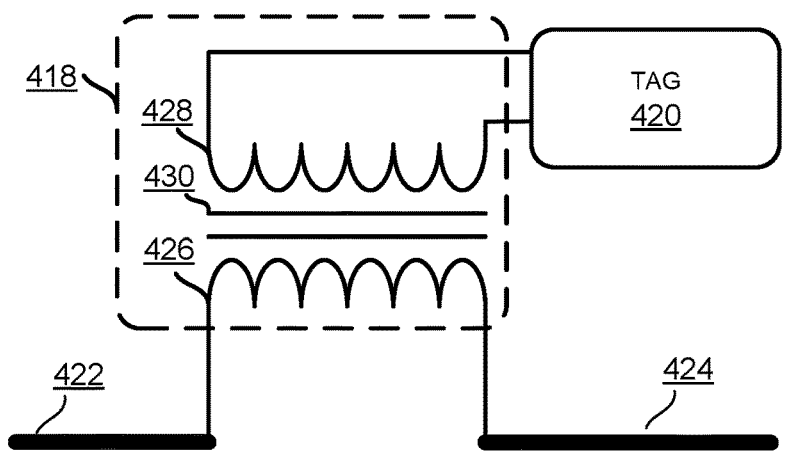

FIGS. 4A, 4B, and 4C illustrate example inductive signal coupling mechanisms usable with identification tags or monitoring device for the electrical continuity detection system.

FIG. 4A illustrates an example ring type current transformer coupler 402 connected to the tag 404. The electrically conductive object 406 may pass through the toroid core 408 with a wound secondary coil 410 to couple signals between the electrically conductive object 406 and the tag 404. The toroid core 408 may comprise of an iron alloy, steel alloy, other magnetic material or combination of materials formed into a split ring or partial ring shape. The ring shape may be solid or split in design.

FIG. 4B illustrates an example inductive coil coupler 412 connected to the tag 414. The electrically conductive object 416 may pass through the inductive coil coupler 412 to couple signals between the electrically conductive object 416 and the tag 414.

FIG. 4C illustrates an example wound primary type current transformer coupler 418 connected to the tag 420. An electrically conductive object is split into two segments 422 and 424, each of which are connected to different sides of the primary coil 426. The primary coil 426 and secondary coil 428 may wind around a core 430 that may comprise of an iron alloy, steel alloy, other magnetic material, or combination of materials to couple signals between the electrically conductive object 422 and 424 and tag 420.

Figure 5A:
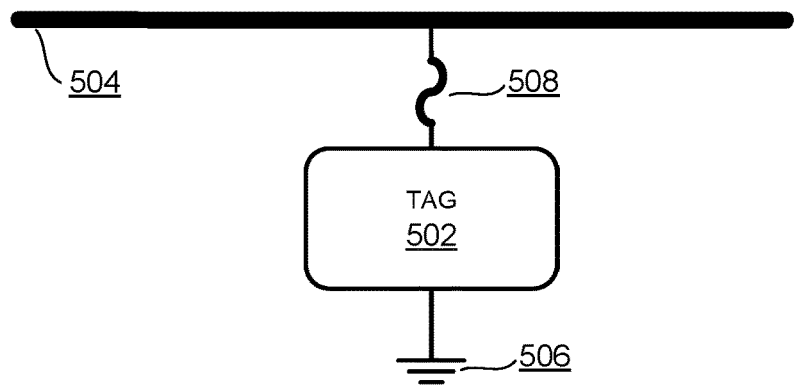
FIGS. 5A, 5B, and 5C illustrate example conductive signal coupling mechanisms usable with identification tags for the electrical continuity detection system.
Figure 5B:
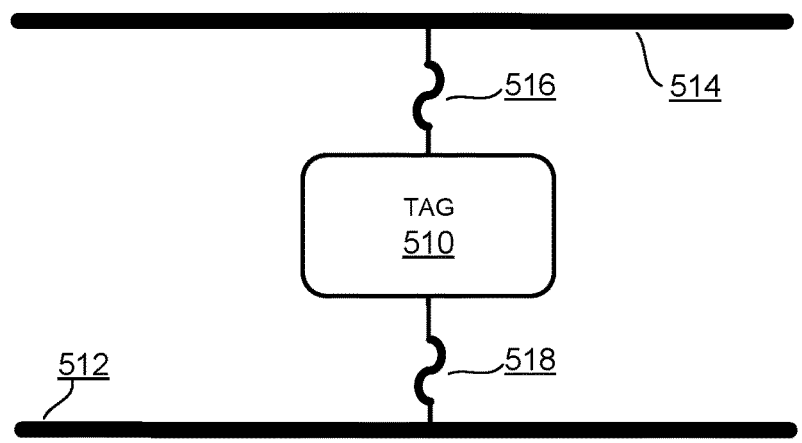
Figure 5C:
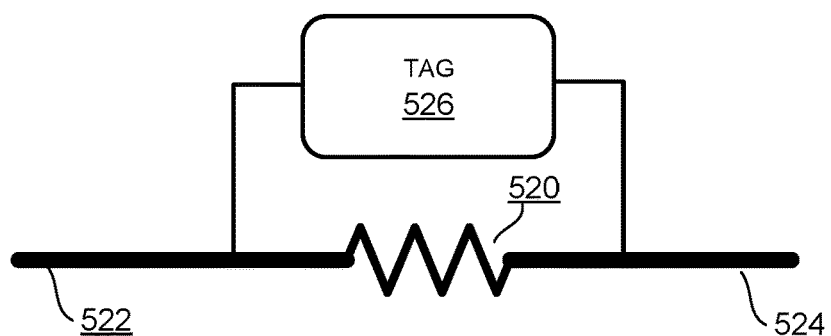

FIGS. 5A, 5B, and 5C illustrate example conductive signal coupling mechanisms usable with identification tags or monitoring device for the electrical continuity detection system.

FIG. 5A illustrates an example conductively coupled tag 502 connected between an electrically conductive object, or a conductor, 504 and earth-ground 506. A fuse 508 may be placed between the tag 502 and the electrically conductive object 504 to prevent a fault in the event that the tag 502 fails.

FIG. 5B illustrates an example conductively coupled tag 510 connected between the two electrically conductive objects 512 and 514. A fuse 516 and 518 may be placed between the tag 510 and the two electrically conductive objects 512 and 514 to prevent a fault in the event that the tag 510 fails.

FIG. 5C illustrates an example current shunt coupler 520 connected to the electrically conductive object split into segment 522 and segment 524, each of which is connected to different sides of the current shunt coupler 520. The tag 526 may be connected to either side of the current shunt coupler 520 to couple signals between the segments 522 and 524 and the tag 526.

Figure 6A:
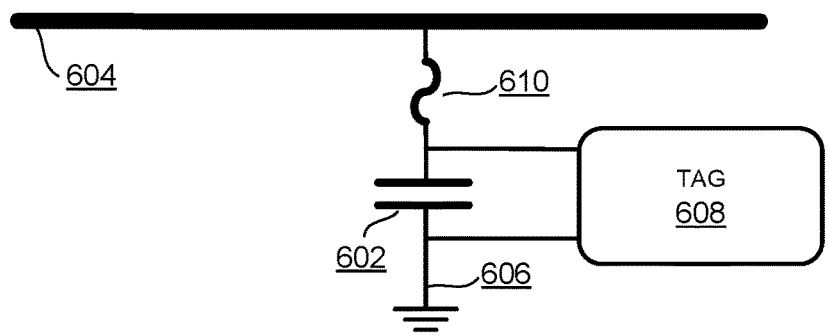
FIGS. 6A, 6B and 6C illustrate example capacitive and potential signal coupling mechanisms usable with identification tags for the electrical continuity detection system.
Figure 6B:
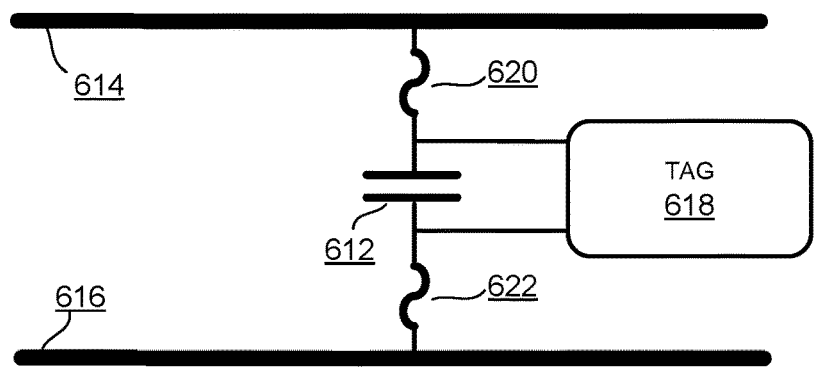
Figure 6C:
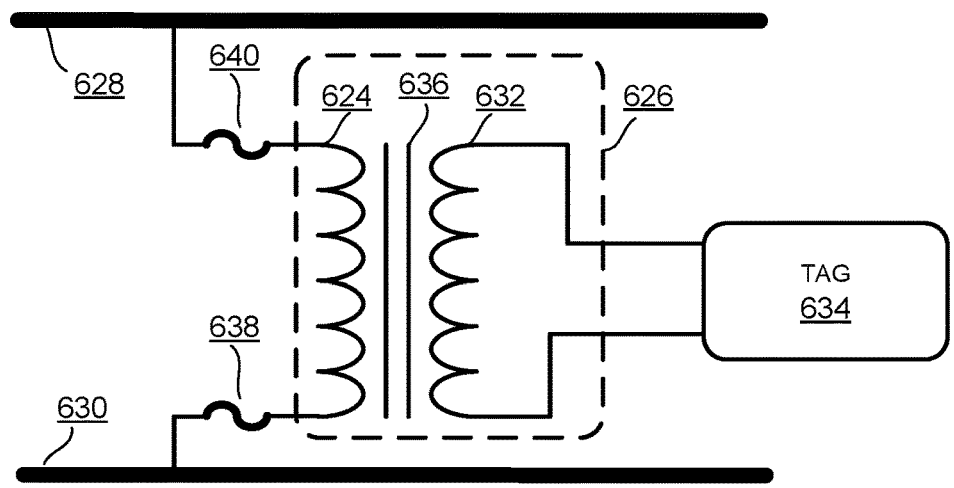

FIGS. 6A, 6B and 6C illustrate example capacitive and potential signal coupling mechanisms usable with identification tags or monitoring device for the electrical continuity detection system.

FIG. 6A illustrates an example capacitor coupler having a capacitor 602 connected between the electrically conductive object 604 and earth-ground 606. The tag 608 may be connected to either side of the capacitor 602 to couple signals between the electrically conductive object 604 and the tag 608. A fuse 610 may reside between the capacitor 602 and the electrically conductive object 604 to prevent a fault in the event that the capacitor 602 or tag 608 fails.

FIG. 6B illustrates another example capacitor coupler having a capacitor 612 connected between the two electrically conductive objects 614 and 616. The tag 618 may be connected to either side of the capacitor 612 to couple signals between the electrically conductive objects 614 and 616 and the tag 618. Fuses 620 and 622 may be placed between the capacitor coupler 612 and the two electrically conductive objects 614 and 616 to prevent a fault in the event that the capacitor 612 or tag 618 fails.

FIG. 6C illustrates a secondary coil 624 of a potential transformer coupler 626 connected between the two electrically conductive objects 628 and 630. A primary coil 632 of the potential transformer coupler 626 may be connected to the tag 634. Both the primary coil 632 and secondary coil 624 may wind around a core 636 that may comprise of an iron alloy, steel alloy, other magnetic material, or combination of materials to couple signals between the electrically conductive objects 628 and 630 and tag 634. Fuses 638 and 640 may be placed between the potential transformer coupler 626 and the two electrically conductive objects 628 and 630 to prevent a fault in the event that the potential transformer 626 or tag 634 fails.

FIGS. 7A and 7B illustrate example signal paths, or electrical loop, between a monitoring device and a tag using the earth as the return electrical path.

FIG. 7A illustrates an example grounded system 702 where the electrically conductive object 704 may be bonded to one or more earth-grounds, such as earth-grounds 706, 708, and 710. The monitoring device 712 may be coupled to the electrically conductive object 704 at a point 714 and bonded to earth-ground 716. A tag 718 may be coupled to an earth-ground 710 at point 720. In this example embodiment the path 722 of injection signals and responses may be from the monitoring device 712, through the electrically conductive object 704, through the earth-ground 710 that the tag 718 is coupled to, and back through the earth-ground 716 of the monitoring device 712 to the monitoring device 712 in either forward or reverse direction (only one direction shown).

FIG. 7B illustrates an example ungrounded system 724 where the electrically conductive object 726 may be isolated from earth. The monitoring device 728 may be coupled to the electrically conductive object 726 at a point 730 and bonded to earth-ground 732. A tag 734 may also be coupled to the electrically conductive object 726 at a point 736 and bonded to earth-ground 738. In this example embodiment the path 740 of injection signals and responses may be from the monitoring device 728, through the electrically conductive object 726, through the tag 736, and back through the earth-grounds 738 and 732 to the monitoring device 728 in either forward or reverse direction (only one direction shown).

FIGS. 8A, and 8B illustrate example signal paths, or electrical loops, between a monitoring device and a tag using one or more electrically conductive objects as the return electrical path.

FIG. 8A illustrates an example ungrounded system 802 where two electrically conductive objects 804 and 806 may be isolated from earth and each other. The monitoring device 808 may be coupled to both electrically conductive objects 804 and 806 at points 810 and 812, respectively. A tag 814 may also be coupled to both electrically conductive objects 804 and 806 at points 816 and 818, respectively. In this example embodiment, the path 820 of the injection signals from the monitoring device 808 and responses from the tag 814 may follow through the electrically conductive object 804, through the tag 814, and back through the electrically conductive object 806 to the monitoring device 808 in either forward or reverse direction (only one direction shown).

FIG. 8B illustrates another example ungrounded system 822 where a single electrically object 824 may be isolated from earth. The monitoring device 826 may be coupled to two different points 828 and 830 along the electrically conductive object 824. A tag 832 may also be coupled to the electrically conductive object 824 at appoint 834. In this example embodiment, the path 836 of injection signals from the monitoring device 826 and responses from the tag 832 may follow through the electrically conductive object 824 past the tag coupling point 834 back to the monitoring device 826 in either forward or reverse direction (only one direction shown).

FIGS. 9A and 9B illustrate example signal paths, or electrical loops, for a monitoring device through an electrically conductive object.

FIG. 9A illustrates a grounded system 902 where the electrically conductive object 904 may be bonded to one or more earth-grounds 906. The monitoring device 908 may be coupled to the electrically conductive object 904 at a point 910 and bonded to earth-ground 912. In this example embodiment, the path 914 of injection signals from the monitoring device 908 and return signals may follow through the electrically conductive object 904, through the earth-grounds 906, and back through the earth-ground 912 of the monitoring device 908 to the monitoring device 908 in either forward or reverse direction (only one direction shown).

FIG. 9B illustrates an example ungrounded system 916 where a single electrically conductive object 918 may be isolated from the earth. The monitoring device 920 may be coupled at two different points 922 and 924 to the electrically conductive object 918. In this example embodiment the path 926 of injection signals from the monitoring device 920 and return signals may follow through the electrically conductive object 918, and back to the monitoring device 920 in either forward or reverse direction (only one direction shown).

Figure 10:
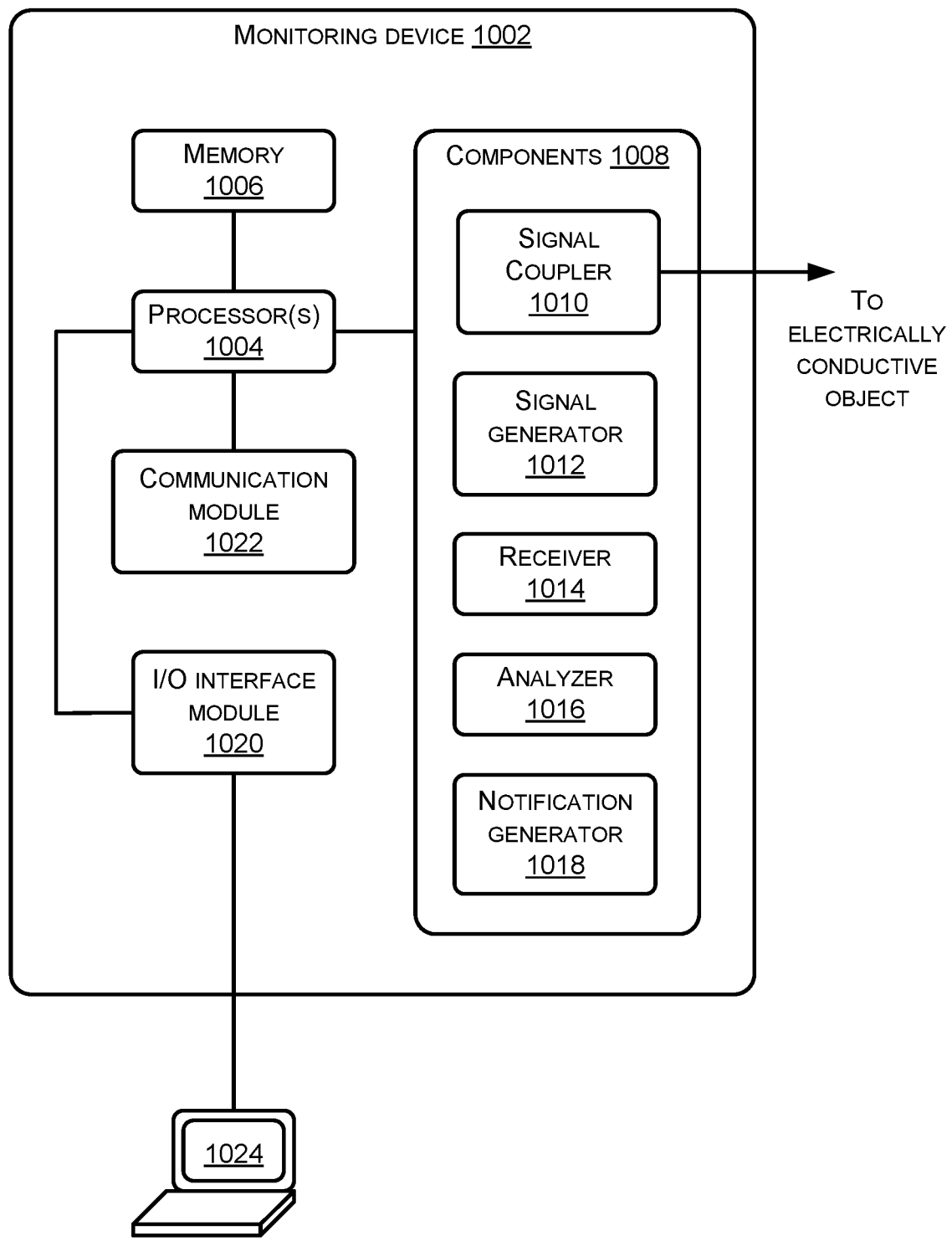
FIG. 10 illustrates an example block diagram of a monitoring device of the electrical continuity detection system.

FIG. 10 illustrates an example block diagram of the monitoring device 1002 of the electrical continuity detection system.

The monitoring device 1002 may comprise one or more processors 1004, memory 1006 coupled to the processor(s) 1004, and a plurality of components 1008 coupled to the processor(s) 1004. The memory 1006 may be configured to store computer-executable instructions that, when executed by the processor(s) 1004, cause the plurality of components 1008 to perform associated operations as described below. The plurality of components 1008 may include a signal coupler 1010, a signal generator 1012, a receiver 1014, an analyzer 1016, and a notification generator 1018.

The signal coupler 1010 may be configured to couple, or conduct, signals between an electrically conductive object, such as a grounding system 108 as shown in FIG. 1, which may be at the same or a different potential from other surrounding objects including the earth and the monitoring device 1002. The signal coupling mechanism associated with signal coupler 1010 may include various types including one or more of inductance, capacitance, or conductance coupling as described above with reference to FIGS. 5A-5C and 6A-6C.

The signal generator 1012 may be configured to generate an injection signal and to inject the signal at an injection signal coupling point onto an electrically conductive object such as the ground system 102 as described above with reference to FIG. 1 or ungrounded conductors in a building electrical system as described above with reference to FIG. 3. The signal generator 1012 may also generate a plurality of signals which may be continuous, periodic, or intermittent. The receiver 1014 may be configured to receive a response from a plurality of tags 144-170 as described above with reference to FIGS. 1 and 2. Each tag may be configured to respond to the injection signal from the monitoring device 142 with a unique response including its identification information as described above with regard to FIG. 1. The analyzer 1016 may be configured to monitor a change in a corresponding response and attributes associated with the response of each of the plurality of signals. The attributes may include a reflected injection signal, a voltage, a current, a phase angle, a frequency, a latency, a duration, a slew rate, or a frequency response frequency of the signal where each of the plurality of signals may have a different response attributes from one another. For each signal, i.e., for each frequency, the analyzer 1016 may measure and record a corresponding response and determine, measure, or derive, associated attributes (default attributes) of the undisturbed grounding system 102 having all the expected components attached to it (default ground loop configuration). The corresponding signal characteristic may include calculated resultants such as a resistance, an inductance, a capacitance, an impedance, a phase shift, a frequency shift, or an electrical length and/or a reflection pattern or coefficient of the default ground loop configuration. The analyzer 1016 may be configured to determine a characteristic of the electrically conductive object based on the received responses and return signals and compare them to the corresponding default attributes, and the notification generator 1018 may be configured to generate a notification based on the characteristic determined by the analyzer 1016. The characteristic of the electrically conductive object may be based on receiving responses from less than all of the plurality of tags including no responses at all. The memory 1006 may further be configured to store location information associated with each of the plurality of tags.

As a part of the characteristic of the electrically conductive object, the analyzer 1016 may further be configured to identify one or more missing, or non-responsive, tags of the plurality of the tags based on the receiver 1014 failing to receive the corresponding responses from less than all of the tags and identify locations of the one or more missing, or non-responsive tags based on the stored location information. For example, as described with reference to FIG. 2, if, in response to an injection signal from the signal generator 1012 of the monitoring device 1002 on the electrically conductive object 102, the receiver 1014 were to fail to receive responses from the tags 158, 162, 166, and 170, the analyzer 1016 would identify the non-responsive, or missing, tags as the tags 158, 162, 166, and 170, and determined the associated locations based on the stored location information in the memory 1006 as the locations of the equipment 104, 106, 108 and 110. Alternatively, or additionally, the analyzer 1016 may identify the responding one or more tags, instead of the missing ones, and identify the locations of the responding one or more tags based on the stored location information. The analyzer 1016 may analyze a derivative of the reflected injection signal to identify the responding tag. The analyzer 1016 may also timestamp the response.

The notification generator 1018 may generate a notification, based on the characteristic of the electrically conductive object determined by the analyzer 1016. The notification may include the location information of the missing one or more tag, the location information of the responding one or more tag, a visual notification, displayed at the monitoring device 1002, a visual notification displayed remote from the monitoring device 1002, such as a warning light or a sign on the fence 116 or at an entrance to the substation 100 or building 400, an audio notification, such as a siren or warning sound, at the monitoring device 1002, an audio notification remote from the monitoring device 1002, such as a siren or a warning sound from speaker on the fence 116, or at an entrance to the substation 100, a tactile notification at the location of the monitoring device 1002, such as alerting vibrations in the floor of an electrical room (not shown) or substation panel house 182, a tactile notification remote from the monitoring device 1002, such as a vibration on a worker's mobile phone (not shown) or other personal device (not shown), an electronic notification broadcast from the monitoring device 1002, such as a wireless beacon signal that can be received by a personal safety device worn by a worker (not shown), and an electronic notification transmitted from the monitoring device 1002 to another monitoring station, such as a wireless communication to a data center informing the missing tags and their locations.

Additionally, or alternatively, the signal generator 1012 may further be configured to generate an injection signal comprising a plurality of signals, where each of the plurality of signals has a corresponding injection signal attribute, such as a different frequency from one another, and the analyzer 1016 may further be configured to, for each of the plurality of return signals, monitor a change in a response attributes, such as a voltage, a current, a phase angle, a frequency, a latency, a duration, a slew rate, or a frequency response and detect whether the corresponding change exceeds a threshold. The analyzer 1016 may use the response attributes from one or more return signals to analyze a calculated resultant, such as a resistance, an inductance, a capacitance, an impedance, a phase shift, a frequency shift, or an electrical length and detect whether the corresponding change exceeds a threshold. Response attributes and calculated resultants may correspond to the different frequencies and a reflection pattern corresponding to the different frequencies. For example, the signal generator 1012 may generate five different frequency signals, $f_1$ Hz, $f_2$ Hz, $f_3$ Hz, $f_4$ Hz, and $f_5$ Hz, and the analyzer 1016 may measure and record the corresponding default attributes and calculated resultants, such as impedance, as $Z_1\Omega$, $Z_2\Omega$, $Z_3\Omega$, $Z_4\Omega$, and $Z_5\Omega$, respectively. If the analyzer 1016 were to detect a change that is larger, negatively or positively, than a threshold, the notification generator 1018 may send a notification. For example, for each frequency, $f_1$ Hz, $f_2$ Hz, $f_3$ Hz, $f_4$ Hz, and $f_5$ Hz, there may be a corresponding threshold, $\Delta_1\Omega$, $\Delta_2\Omega$, $\Delta_3\Omega$, $\therefore_4\Omega$, and $\Delta_5\Omega$, respectively, and if a preselected one or any combination of the impedances exceeds the threshold(s), the notification generator 1018 may generate a notification and/or transmit a notification as described above.

Additionally, or alternatively, the monitoring device 1002 may inject the injection signal, or the plurality of signals onto the electrically conductive object, such as the grounding system 102, with no tags attached. Similar to the process described above, the receiver 1014 may receive a reflected signal via the signal coupler 1010, and the analyzer 1016 may monitor a change in the reflected signal and attributes associated with the reflected signal for each of the plurality of signals.

In some embodiments, the processor(s) 1004 may include a central processing unit (CPU), a graphics processing unit (GPU), both CPU and GPU, or other processing units or components known in the art. Additionally, each of the processor(s) 1004 may possess its own local memory, which also may store program modules, program data, and/or one or more operating systems.

Depending on the exact configuration and type of the monitoring device 1002, the memory 1006 may be volatile, such as RAM, non-volatile, such as ROM, flash memory, miniature hard drive, memory card, and the like, or some combination thereof. The memory 1006 may include an operating system, one or more program modules, and may include program data.

The monitoring device 1002 may additionally comprise an input/output (I/O) interface module 1020 and a communication module 1022 coupled to the processor(s) 1004. The I/O interface module 1020 may be configured to communicate with a programming device, such as a computing device 1024 loaded with appropriate applications for programming the monitoring device 1002 or checking and/or downloading the status of the monitoring device 1002. The computing device 1024 may have input device(s), such as a keyboard, a mouse, a pen, a voice input device, a touch input device, and the like, and output device(s), such as a display, speakers, a printer, and the like. The I/O interface module 1020 may comprise a connector, such as a telco connector, a USB connector, a RJ45 connector, and the like, for communication with the computing device 1024. The communication module 1022 may include an RF communication module such as a near field communication (NFC), Bluetooth communication, Wifi communication module, and/or a cellular communication module for communicating with the computing device 1024 or a remote device, such as a communication device in the data center (not shown) or a cellular device of a utility worker for the substation 100 or building 400.

The techniques and mechanisms of the electrical continuity detection system and the monitoring device 1002 described above with reference to FIGS. 1-10 are examples of such devices and are not intended to suggest any limitation as to the scope of use or functionality of any device utilized to perform the processes and/or procedures described above.

Some or all operations described above can be performed by execution of computer-readable instructions stored on a computer-readable storage medium, as defined below. The term "computer-readable instructions" as used in the description and claims, include routines, applications, application modules, program modules, programs, components, data structures, algorithms, and the like. Computer-readable instructions can be implemented on various system configurations, including single-processor or multiprocessor systems, minicomputers, mainframe computers, personal computers, hand-held computing devices, microprocessor-based, programmable consumer electronics, combinations thereof, and the like.

The computer-readable storage media may include volatile memory, such as random-access memory (RAM), and/or non-volatile memory, such as read-only memory (ROM), flash memory, etc. The computer-readable storage media may also include additional removable storage and/or non-removable storage including, but not limited to, flash memory, magnetic storage, optical storage, and/or tape storage that may provide non-volatile storage of computer-readable instructions, data structures, program modules, and the like.

A non-transient computer-readable storage medium is an example of computer-readable media. Computer-readable media includes at least two types of computer-readable media, namely computer-readable storage media and communications media. Computer-readable storage media includes volatile and non-volatile, removable and non-removable media implemented in any process or technology for storage of information such as computer-readable instructions, data structures, program modules, or other data. Computer-readable storage media includes, but is not limited to, phase change memory (PRAM), static random-access memory (SRAM), dynamic random-access memory (DRAM), other types of random-access memory (RAM), read-only memory (ROM), electrically erasable programmable read-only memory (EEPROM), flash memory or other memory technology, compact disk read-only memory (CD-ROM), digital versatile disks (DVD) or other optical storage, magnetic cassettes, magnetic tape, magnetic disk storage or other magnetic storage devices, or any other non-transmission medium that can be used to store information for access by a computing device. In contrast, communication media may embody computer-readable instructions, data structures, program modules, or other data in a modulated data signal, such as a carrier wave, or other transmission mechanism. As defined herein, computer-readable storage media do not include communication media.

The computer-readable instructions stored on one or more non-transitory computer-readable storage media that, when executed by one or more processors, may perform operations, or cause the components perform associated operations, described above with reference to FIGS. 1-10. Generally, computer-readable instructions include routines, programs, objects, components, data structures, and the like that perform particular functions or implement particular abstract data types. The order in which the operations are described is not intended to be construed as a limitation, and any number of the described operations can be combined in any order and/or in parallel to implement the processes.

EXAMPLE CLAUSES

A. A monitoring device comprising: one or more processors; memory coupled to the one or more processors, the memory configured to store computer-executable instructions that, when executed by the one or more processors, cause components of the monitoring device to perform associated operations; and the components coupled to the one or more processors, the components including: a signal coupler configured to couple an injection signal between an electrically conductive object and the monitoring device, a signal generator configured to generate the injection signal and to inject the injection signal onto the electrically conductive object through the signal coupler, a receiver configured to receive a response from each of a plurality of tags through the signal coupler, the plurality of tags placed on the electrically conductive object, each tag of the plurality of tags configured to respond to the injection signal with a corresponding response, an analyzer configured to determine a characteristic of the electrically conductive object based on the received responses, and a notification generator configured to generate a notification based on the characteristic.

B. The monitoring device as paragraph A recites, wherein a type of the signal coupler includes: an inductive coupler, a capacitive coupler, or a conductive coupler.

C. The monitoring device as paragraph B recites, wherein the signal coupler is further configured to allow transmission of the injection signal by at least one of: coupling to the electrically conductive object at a single coupling point and grounded through an earth-ground forming an electrical loop with the electrically conductive object and the earth-ground, coupling to the electrically conductive object at two coupling points forming an electrical loop through the electrically conductive object, or coupling to the electrically conductive object and another electrically conductive object forming an electrical loop with a combination of the electrically conductive object and the another electrically conductive object, the combination being electrically isolated from each other except at an injection signal coupling point.

D. The monitoring device as paragraph A recites, wherein the injection signal includes: one or more signals, each of the one or more signal being at least one of: continuous, periodic, or intermittent.

E. The monitoring device as paragraph A recites, wherein the memory is further configured to store location information associated with each of the plurality of tags.

F. The monitoring device as paragraph E recites, wherein the response from each of the plurality of tags includes at least one of: a corresponding unique identity of the tag, or a reflected injection signal.

G. The monitoring device as paragraph F recites, wherein, upon the receiver receiving one or more responses, the analyzer is further configured to determine location information of the corresponding tag based on each received response.

H. The monitoring device as paragraph G recites, wherein the analyzer is further configured to monitor attributes of the corresponding response, the attributes including at least one of: a voltage, a current, a phase angle, a phase shift, a frequency, a frequency shift, a resistance, an inductance, a capacitance, an impedance, a latency, a duration, an electrical length, a slew rate, or a frequency response.

I. The monitoring device as paragraph H recites, wherein the characteristic of the electrically conductive object based on the received responses includes a characteristic based on receiving responses from less than all of the plurality of tags.

J. The monitoring device as paragraph I recites, wherein the analyzer is further configured to identify, at least one of: one or more missing tags of the plurality of the tags from which the receiver fails to receive the corresponding responses, and locations of the one or more missing tags based on the stored location information, or one or more responding tags of the plurality of the tags from which the receiver receives the corresponding responses, and locations of the one or more responding tags based on the stored location information.

K. The monitoring device as paragraph J recites, wherein the analyzer is further configured to: detect a change in one or more of the attributes; and determine whether the change exceeds a threshold.

L. The monitoring device as paragraph K recites, wherein the notification includes at least one of: location information of the one or more missing tags, location information of the one or more responding tags, a characteristic of the electrically conductive object based on the received responses, the attribute associated with the change determined to exceed the threshold, a visual notification displayed at the monitoring device, a visual notification displayed remote from the monitoring device, an audio notification at the monitoring device, an audio notification remote from the monitoring device, a tactile notification at the monitoring device, a tactile notification remote from the monitoring device, an electronic notification transmitted from the monitoring device to at least one of a monitoring station or a remote device, or an electronic notification broadcasted from the monitoring device.

M. A tag comprising: a signal coupler configured to couple an injection between an electrically conductive object and the tag; a receiver configured to receive the injection signal via the signal coupler, and a responder configured to send a response to a received injection signal.

N. The tag as paragraph M recites, wherein a type of the signal coupler includes: an inductive coupler, a capacitive coupler, or a conductive coupler.

O. The tag as paragraph N recites, wherein the signal coupler is further configured to allow transmission of the injection signal by at least one of: coupling to the electrically conductive object at a single coupling point and grounded through an earth-ground forming an electrical loop with the electrically conductive object and the earth-ground, coupling to the electrically conductive object at two coupling points forming an electrical loop through the electrically conductive object, or coupling to the electrically conductive object and another electrically conductive object forming an electrical loop with a combination of the electrically conductive object and the another electrically conductive object, the combination being electrically isolated from each other except at an injection signal coupling point.

P. The tag as paragraph O recites, wherein the response includes at least one of: a unique identity of the tag, or a reflected injection signal.

Q. The tag as paragraph P recites, wherein the responder is further configured to: respond to the injection signal that has an injection attribute within a threshold range, or respond to all injection signals.

R. An electrical continuity detection system comprising: a plurality of tags placed on an electrically conductive object, each tag configured to respond to an injection signal on the electrically conductive object with a response; and a monitoring device coupled to the electrically conductive object, the monitoring device configured to: store location information associated with each of the plurality of tags, generate the injection signal on the electrically conductive object, receive a response from each of the plurality of tags, determine a characteristic of the electrically conductive object based on the received responses, and generate a notification based on the characteristic.

S. The electrical continuity detection system as paragraph R recites, wherein each of the plurality of tags is configured to allow transmission of the injection signal by at least one of: coupling to the electrically conductive object at a single coupling point and grounded through an earth-ground forming an electrical loop with the electrically conductive object and an earth-ground, coupling to the electrically conductive object at two coupling points forming an electrical loop through the electrically conductive, or coupling to the electrically conductive object and another electrically conductive object forming an electrical loop with a combination of the electrically conductive object and the another electrically conductive object, the combination being electrically isolated from each other except at an injection signal coupling point, wherein the coupling is by at least one of capacitive, inductive, or conductive.

T. The electrical continuity detection system as paragraph R recites, wherein the injection signal includes: one or more signals, each of the one or more signal being at least one of: continuous, periodic, or intermittent.

U. The electrical continuity detection system as paragraph R recites, wherein the response from each of the plurality of tags includes at least one of: a corresponding unique identity of the tag, or a reflected injection signal.

V. The electrical continuity detection system as paragraph U recites, wherein the monitoring device is further configured to determine location information of the corresponding tag based on each received response.

W. The electrical continuity detection system as paragraph V recites, wherein attributes of the corresponding response include at least one of: a voltage, a current, a phase angle, a phase shift, a frequency, a frequency shift, a resistance, an inductance, a capacitance, an impedance, a latency, a duration, an electrical length, a slew rate, or a frequency response.

X. The electrical continuity detection system as paragraph W recites, wherein the characteristic of the electrically conductive object based on the received responses includes a characteristic based on receiving responses from less than all of the plurality of tags.

Y. The electrical continuity detection system as paragraph X recites, wherein the monitoring device is further configured to identify, at least one of: one or more missing tags of the plurality of the tags from which no corresponding responses are received, and locations of the one or more missing tags based on the stored location information, or one or more responding tags of the plurality of the tags from which the corresponding responses are received, and locations of the one or more responding tags based on the stored location information.

Z. The electrical continuity detection system as paragraph Y recites, wherein the monitoring device is further configured to: detect a change in one or more of the attributes; and determine whether the change exceeds a threshold.

AA. The electrical continuity detection system as paragraph Z recites, wherein the notification includes at least one of: location information of the one or more missing tags, location information of the one or more responding tags, characteristic of the electrically conductive object based on the received responses, the attribute associated with the change determined to exceed the threshold, a visual notification displayed at the monitoring device, a visual notification displayed remote from the monitoring device, an audio notification at the monitoring device, an audio notification remote from the monitoring device, a tactile notification at the monitoring device, a tactile notification remote from the device, an electronic notification transmitted from the monitoring device to at least one of a monitoring station or a remote device, or an electronic notification broadcasted from the monitoring device.

AB. A monitoring device comprising: one or more processors; memory coupled to the one or more processors, the memory configured to store computer-executable instructions that, when executed by the one or more processors, cause components of the monitoring device to perform associated operations; and the components coupled to the one or more processors, the components including: a signal coupler configured to couple an injection signal between an electrically conductive object and the monitoring device, a signal generator configured to generate the injection signal and to inject the injection signal onto the electrically conductive object through the signal coupler, a receiver configured to receive a return signal resulting from the injection signal, an analyzer configured to determine a characteristic of the electrically conductive object based on the received return signal, and a notification generator configured to generate a notification based on the characteristic.

AC. The monitoring device as paragraph AB, wherein the signal coupler is further configured to allow transmission of the injection signal by at least one of: coupling to the electrically conductive object at a single coupling point and grounded through an earth-ground forming an electrical loop with the electrically conductive object and the earth-ground, coupling to the electrically conductive object at two coupling points forming an electrical loop through the electrically conductive object, or coupling to the electrically conductive object and another electrically conductive object forming an electrical loop with a combination of the electrically conductive object and the another electrically conductive object, the combination being electrically isolated from each other except at an injection signal coupling point, wherein the coupling is by at least one of capacitive, inductive, or conductive.

AD. The monitoring device as paragraph AB recites, wherein the injection signal includes: one or more signals, each of the one or more signal being at least one of: continuous, periodic, or intermittent.

AE. The monitoring device as paragraph AB recites, wherein attributes of the received return signal includes at least one of: a reflected injection signal, a voltage, a current, a phase angle, a phase shift, a frequency, a frequency shift, a resistance, an inductance, a capacitance, an impedance, a latency, a duration, an electrical length, a slew rate, or a frequency response.

AF. The monitoring device as paragraph AE recites, wherein the analyzer is further configured to: detect a change in one or more of the attributes; and determine whether the change exceeds a threshold.

AG. The monitoring device as paragraph AF recites, wherein the notification includes at least one of: a characteristic of the electrically conductive object based on the received return signal, the attribute associated with the change determined to exceed the threshold, a visual notification displayed at the monitoring device, a visual notification displayed remote from the monitoring device, an audio notification at the monitoring device, an audio notification remote from the monitoring device, a tactile notification at the monitoring device, a tactile notification remote from the monitoring device, an electronic notification transmitted from the monitoring device to at least one of a monitoring station or a remote device, or an electronic notification broadcasted from the monitoring device.

CONCLUSION

Although the subject matter has been described in language specific to structural features and/or methodological acts, it is to be understood that the subject matter defined in the appended claims is not necessarily limited to the specific features or acts described. Rather, the specific features and acts are disclosed as exemplary forms of implementing the claims.

What is claimed is:

1. A monitoring device comprising:
   one or more processors;
   memory coupled to the one or more processors, the memory configured to store computer-executable instructions that, when executed by the one or more processors, cause components of the monitoring device to perform associated operations; and
   the components coupled to the one or more processors, the components including:
      a signal coupler configured to couple an injection signal between an electrically conductive object and the monitoring device,
      a signal generator configured to generate the injection signal and to inject the injection signal onto the electrically conductive object through the signal coupler,
      a receiver configured to receive a response from each of a plurality of tags through the signal coupler, the plurality of tags placed on the electrically conductive object, each tag of the plurality of tags configured to respond to the injection signal with a corresponding response,
      an analyzer configured to determine a characteristic of the electrically conductive object based on the received responses, and
      a notification generator configured to generate a notification based on the characteristic.

2. The monitoring device of claim 1, wherein a type of the signal coupler includes:
   an inductive coupler,
   a capacitive coupler, or
   a conductive coupler.

3. The monitoring device of claim 2, wherein the signal coupler is further configured to allow transmission of the injection signal by at least one of:

coupling to the electrically conductive object at a single coupling point and grounded through an earth-ground forming an electrical loop with the electrically conductive object and the earth-ground, coupling to the electrically conductive object at two coupling points forming an electrical loop through the electrically conductive object, or coupling to the electrically conductive object and another electrically conductive object forming an electrical loop with a combination of the electrically conductive object and the another electrically conductive object, the combination being electrically isolated from each other except at an injection signal coupling point.

4. The monitoring device of claim 1, wherein the injection signal includes:
one or more signals, each of the one or more signals being at least one of:
continuous,
periodic, or
intermittent.

5. The monitoring device of claim 1, wherein the memory is further configured to store location information associated with each of the plurality of tags.

6. The monitoring device of claim 5, wherein the response from each of the plurality of tags includes at least one of:
a corresponding unique identity of the tag, or
a reflected injection signal.

7. The monitoring device of claim 6, wherein, upon the receiver receiving one or more responses, the analyzer is further configured to determine location information of the corresponding tag based on each received response.

8. The monitoring device of claim 7, wherein the analyzer is further configured to monitor attributes of the corresponding response, the attributes including at least one of:
a voltage,
a current,
a phase angle,
a phase shift,
a frequency,
a frequency shift,
a resistance,
an inductance,
a capacitance,
an impedance,
a latency,
a duration,
an electrical length,
a slew rate, or
a frequency response.

9. The monitoring device of claim 8, wherein the characteristic of the electrically conductive object based on the received responses includes a characteristic based on receiving responses from less than all of the plurality of tags.

10. The monitoring device of claim 9, wherein the analyzer is further configured to identify, at least one of:
one or more missing tags of the plurality of tags from which the receiver fails to receive the corresponding responses, and locations of the one or more missing tags based on the stored location information, or
one or more responding tags of the plurality of tags from which the receiver receives the corresponding responses, and locations of the one or more responding tags based on the stored location information.

11. The monitoring device of claim 10, wherein the analyzer is further configured to:
detect a change in one or more of the attributes; and
determine whether the change exceeds a threshold.

12. The monitoring device of claim 11, wherein the notification includes at least one of:
location information of the one or more missing tags,
location information of the one or more responding tags,
a characteristic of the electrically conductive object based on the received responses,
the attribute associated with the change determined to exceed the threshold,
a visual notification displayed at the monitoring device,
a visual notification displayed remote from the monitoring device,
an audio notification at the monitoring device,
an audio notification remote from the monitoring device,
a tactile notification at the monitoring device,
a tactile notification remote from the monitoring device,
an electronic notification transmitted from the monitoring device to at least one of a monitoring station or a remote device, or
an electronic notification broadcasted from the monitoring device.

13. A tag comprising:
a signal coupler configured to couple to an electrically conductive object,
a receiver configured to receive an injection signal via the signal coupler, and
a responder configured to send a response to the injection signal, the response being associated with an electrical continuity of the electrically conductive object.

14. The tag of claim 13, wherein a type of the signal coupler includes:
an inductive coupler,
a capacitive coupler, or
a conductive coupler.

15. The tag of claim 14, wherein the signal coupler is further configured to allow transmission of the injection signal by at least one of:
coupling to the electrically conductive object at a single coupling point and grounded through an earth-ground forming an electrical loop with the electrically conductive object and the earth-ground,
coupling to the electrically conductive object at two coupling points forming an electrical loop through the electrically conductive object, or
coupling to the electrically conductive object and another electrically conductive object forming an electrical loop with a combination of the electrically conductive object and the another electrically conductive object, the combination being electrically isolated from each other except at an injection signal coupling point.

16. The tag of claim 13, wherein the response further includes at least one of:
a unique identity of the tag, or
a reflected injection signal.

17. The tag of claim 16, wherein the responder is further configured to:
respond to the injection signal that has an injection attribute within a threshold range, or
respond to all injection signals.

18. An electrical continuity detection system comprising:
a plurality of tags placed on an electrically conductive object, each tag configured to respond to an injection signal on the electrically conductive object with a response; and
a monitoring device coupled to the electrically conductive object, the monitoring device configured to:
store location information associated with each of the plurality of tags, generate the injection signal on the electrically conductive object,
receive a response from each of the plurality of tags,
determine a characteristic of the electrically conductive object based on the received responses, and
generate a notification based on the characteristic.

19. The electrical continuity detection system of claim 18, wherein each of the plurality of tags is configured to allow transmission of the injection signal by at least one of:
coupling to the electrically conductive object at a single coupling point and grounded through an earth-ground forming an electrical loop with the electrically conductive object and an earth-ground,
coupling to the electrically conductive object at two coupling points forming an electrical loop through the electrically conductive object, or
coupling to the electrically conductive object and another electrically conductive object forming an electrical loop with a combination of the electrically conductive object and the another electrically conductive object, the combination being electrically isolated from each other except at an injection signal coupling point, wherein the coupling is by at least one of capacitive, inductive, or conductive.

20. The electrical continuity detection system of claim 18, wherein the injection signal includes:
one or more signals, each of the one or more signals being at least one of:
continuous,
periodic, or
intermittent.

21. The electrical continuity detection system of claim 18, wherein the response from each of the plurality of tags includes at least one of:
a corresponding unique identity of the tag, or
a reflected injection signal.

22. The electrical continuity detection system of claim 21, wherein the monitoring device is further configured to determine location information of the corresponding tag based on each received response.

23. The electrical continuity detection system of claim 22, wherein attributes of the corresponding response include at least one of:
a voltage,
a current,
a phase angle,
a phase shift,
a frequency,
a frequency shift,
a resistance,
an inductance,
a capacitance,
an impedance,
a latency,
a duration,
an electrical length,
a slew rate, or
a frequency response.

24. The electrical continuity detection system of claim 23, wherein the characteristic of the electrically conductive object based on the received responses includes a characteristic based on receiving responses from less than all of the plurality of tags.

25. The electrical continuity detection system of claim 24, wherein the monitoring device is further configured to identify, at least one of:
one or more missing tags of the plurality of the tags from which no corresponding responses are received, and locations of the one or more missing tags based on the stored location information, or
one or more responding tags of the plurality of the tags from which the corresponding responses are received, and locations of the one or more responding tags based on the stored location information.

26. The electrical continuity detection system of claim 25, wherein the monitoring device is further configured to:
detect a change in one or more of the attributes; and
determine whether the change exceeds a threshold.

27. The electrical continuity detection system of claim 26, wherein the notification includes at least one of:
location information of the one or more missing tags,
location information of the one or more responding tags,
characteristic of the electrically conductive object based on the received responses,
the attribute associated with the change determined to exceed the threshold,
a visual notification displayed at the monitoring device,
a visual notification displayed remote from the monitoring device,
an audio notification at the monitoring device,
an audio notification remote from the monitoring device,
a tactile notification at the monitoring device,
a tactile notification remote from the monitoring device,
an electronic notification transmitted from the monitoring device to at least one of a monitoring station or a remote device, or
an electronic notification broadcasted from the monitoring device.

28. A monitoring device comprising:
one or more processors;
memory coupled to the one or more processors, the memory configured to store computer-executable instructions that, when executed by the one or more processors, cause components of the monitoring device to perform associated operations; and
the components coupled to the one or more processors, the components including:
a signal coupler configured to couple an injection signal between an electrically conductive object and the monitoring device,
a signal generator configured to generate the injection signal and to inject the injection signal onto the electrically conductive object through the signal coupler,
a receiver configured to receive a return signal resulting from the injection signal,
an analyzer configured to determine a characteristic of the electrically conductive object based on the received return signal, and
a notification generator configured to generate a notification based on the characteristic.

29. The monitoring device of claim 28, wherein the signal coupler is further configured to allow transmission of the injection signal by at least one of:
coupling to the electrically conductive object at a single coupling point and grounded through an earth-ground forming an electrical loop with the electrically conductive object and the earth-ground,
coupling to the electrically conductive object at two coupling points forming an electrical loop through the electrically conductive object, or
coupling to the electrically conductive object and another electrically conductive object forming an electrical loop with a combination of the electrically conductive object and the another electrically conductive object, the combination being electrically isolated from each other except at an injection signal coupling point,
wherein the coupling is by at least one of capacitive, inductive, or conductive.

30. The monitoring device of claim 28, wherein the injection signal includes:
one or more signals, each of the one or more signals being at least one of:
continuous,
periodic, or
intermittent.

31. The monitoring device of claim 28, wherein attributes of the received return signal includes at least one of:
a reflected injection signal,
a voltage,
a current,
a phase angle,
a phase shift,
a frequency,
a frequency shift,
a resistance,
an inductance,
a capacitance,
an impedance,
a latency,
a duration,
an electrical length,
a slew rate, or
a frequency response.

32. The monitoring device of claim 31, wherein the analyzer is further configured to:
detect a change in one or more of the attributes; and
determine whether the change exceeds a threshold.

33. The monitoring device of claim 32, wherein the notification includes at least one of:
a characteristic of the electrically conductive object based on the received return signal,
the attribute associated with the change determined to exceed the threshold,
a visual notification displayed at the monitoring device,
a visual notification displayed remote from the monitoring device,
an audio notification at the monitoring device,
an audio notification remote from the monitoring device,
a tactile notification at the monitoring device,
a tactile notification remote from the monitoring device,
an electronic notification transmitted from the monitoring device to at least one of a monitoring station or a remote device, or
an electronic notification broadcasted from the monitoring device.

* * * * *